US006890046B1

(12) United States Patent
Fukano et al.

(10) Patent No.: US 6,890,046 B1
(45) Date of Patent: May 10, 2005

(54) DRIVING WAVEFORM GENERATOR AND METHOD OF GENERATING DRIVING WAVEFORM

(75) Inventors: Takakazu Fukano, Nagano-ken (JP); Noboru Tamura, Nagano-ken (JP); Noboru Asauchi, Nagano-ken (JP); Masahiko Yoshida, Nagano-ken (JP); Yuichi Nishihara, Nagano-ken (JP); Toshihiko Katayama, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 1011 days.

(21) Appl. No.: 09/661,265

(22) Filed: Sep. 13, 2000

(30) Foreign Application Priority Data

Sep. 14, 1999 (JP) .......................................... 11-259813
Sep. 14, 1999 (JP) .......................................... 11-259816

(51) Int. Cl.[7] ............................ B41J 29/38; H03B 21/00
(52) U.S. Cl. ............................ 347/10; 327/106; 341/147
(58) Field of Search ....................... 347/10, 11; 84/803, 84/804, 603, 604; 310/317; 327/106, 107; 341/147, 151

(56) References Cited

U.S. PATENT DOCUMENTS

| 3,976,945 A | | 8/1976 | Cox ........................... 307/220 |
| 4,315,219 A | * | 2/1982 | Rocheleau et al. ......... 327/106 |
| 5,914,732 A | | 6/1999 | Sakai et al. .................... 347/10 |

FOREIGN PATENT DOCUMENTS

| EP | 213846 A2 | * | 3/1987 | .......... H04Q/1/457 |
| EP | 0 876 915 A2 | | 11/1998 | ............ B41J/2/045 |
| JP | 58-218948 A | | 12/1983 | |
| JP | 10-211700 | | 8/1998 | ............ B41J/2/045 |
| JP | 10-329313 A | | 12/1998 | |
| JP | 11-20203 A | | 1/1999 | |
| JP | 11-20203 | | 1/1999 | ............ B41J/2/205 |
| JP | 11-42772 A | | 2/1999 | |

OTHER PUBLICATIONS

Patent Abstracts of Japan 10211700A Aug. 11, 1998.
Patent Abstracts of Japan 11020203A Jan. 26, 1999.

* cited by examiner

Primary Examiner—Lamson Nguyen
Assistant Examiner—Blaise Mouttet
(74) Attorney, Agent, or Firm—Sughrue Mion, PLLC

(57) ABSTRACT

The present invention provides a technique that prevents a shift of a driving waveform due to accumulation of errors in a process of generating the driving waveform to drive driving elements on a print head. The technique of the present invention successively sums up a plurality of gradient data at a preset calculation period to give a result of summation and carries out digital-to-analog (D-A) conversion with regard to only specific upper columns in the result of summation in synchronism with the preset calculation period, so as to generate a driving waveform. Each gradient data represents a local gradient of the driving waveform and is stored in a memory. In the process of generating the driving waveform, the technique of the present invention corrects the result of summation to a preset value under a predetermined condition. One preferable embodiment clears specific lower bits in the result of summation in synchronism with a floor signal. Another preferable embodiment forcibly corrects the result of summation to an upper limit value or a lower limit value of a preset range when the result of summation exceeds the preset range. Such correction effectively cancels the potential effects of cumulative error on the driving waveform.

13 Claims, 17 Drawing Sheets

Fig. 10A

No Overflow

```
    1 1 1 0 0 1 0 0     (228 in Decimal Numeral System)
+)  0 0 0 1 0 1 1 0     (22 in Decimal Numeral System)
    ─────────────────
    0 1 1 1 1 1 0 1 0   → Output without any modification
     └ No Carry
```

Fig. 10B

Overflow

```
    1 1 1 0 1 0 1 1     (235 in Decimal Numeral System)
+)  0 0 0 1 0 1 1 0     (22 in Decimal Numeral System)
    ─────────────────
    1 0 0 0 0 0 0 0 1   → Modify to '11111111'
     └ Carry
```

Fig. 10C

No Underflow

```
    0 0 0 1 1 1 0 1     (29 in Decimal Numeral System)
+)  1 1 1 0 1 0 1 0     (-22 in Decimal Numeral System)
    ─────────────────
    1 0 0 0 0 0 1 1 1   → Output without any modification
     └ Carry
```

Fig. 10D

Underflow

```
    0 0 0 0 1 1 0 1     (13 in Decimal Numeral System)
+)  1 1 1 0 1 0 1 0     (-22 in Decimal Numeral System)
    ─────────────────
    0 1 1 1 1 0 1 1 1   → Modify to '00000000'
     └ No Carry
```

Fig. 12

| C | MSB | Q69 | | Q67 |
|---|-----|-----|---|-----|
| 0 | 0 | 0 | 0 | Q64 |
| 1 | 1 | | | |
| 0 | 1 | 0 | 1 | 000000000000000000 |
| 1 | 0 | 1 | 0 | 111111111111111111 |

Fig. 17A  PRIOR ART
NORMAL
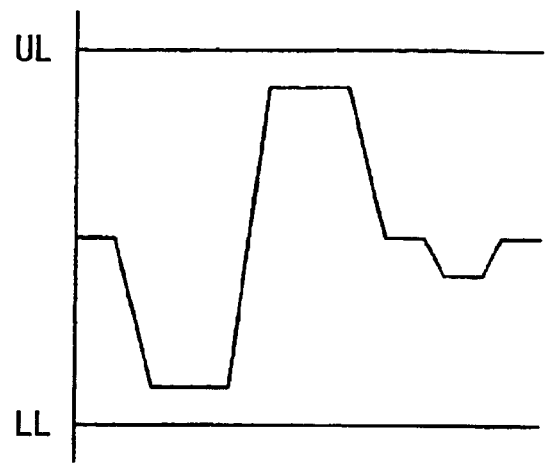
Fig. 17B  PRIOR ART
OVERFLOW
Fig. 17C  PRIOR ART
UNDERFLOW
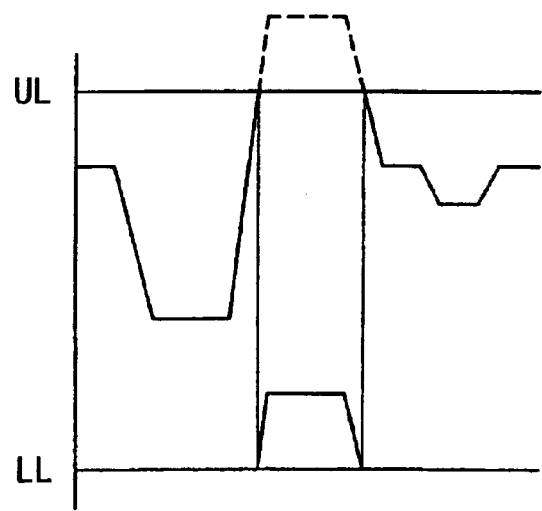
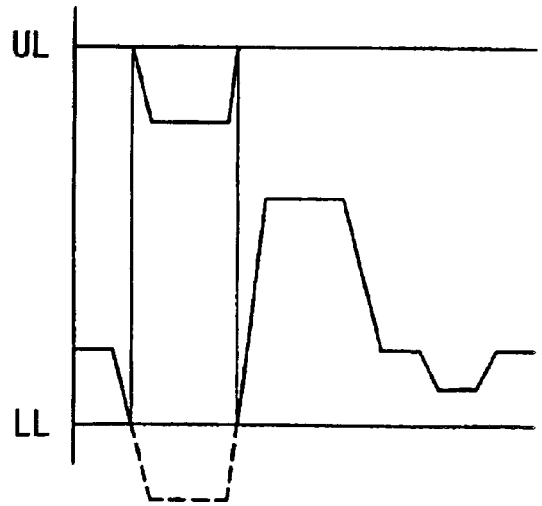

DRIVING WAVEFORM GENERATOR AND METHOD OF GENERATING DRIVING WAVEFORM

BACKGROUND OF THE INVENTION

1. Field of the Invention

The present invention relates to a technique of generating a driving waveform to activate a driving element.

2. Description of the Related Art

Ink jet printers are a known output device of the computer. The ink jet printer causes preset quantities of inks to be ejected from nozzles provided on a print head and create dots on a printing medium, thus printing a multi-color, multi-tone image. One recently proposed technique changes the quantity of ink ejection among a plurality of different levels, in order to attain the smooth tone expression.

Ink ejection is carried out in response to output of a predetermined voltage signal to driving elements provided on the print head, that is, a driving waveform. In the case where piezoelectric elements are applied for the driving elements, the driving waveform controls operations of the piezoelectric elements and regulates the quantity of ink ejection.

A programmable generation technique, which has been proposed as one method of generating the driving waveform, presets voltage variation data and sums up the values of the voltage variation data at predetermined time intervals to determine a voltage signal. This technique advantageously reduces the amount of data stored for generating the driving waveform and enables diverse driving waveforms to be generated by the relatively simple signal processing.

FIG. 14 is a block diagram illustrating the internal structure of a driving waveform generation circuit 100 that implements the programmable generation technique. FIG. 15 shows a process of generating a driving waveform by the programmable generation technique. The driving waveform generation circuit 100 includes a memory 102, an accumulator 104, and a digital-to-analog converter 106. Three gradient data, that is, voltage steps $\Delta V1$, $\Delta V2$, and $\Delta V3$ each applied to a period t of a clock signal CLK, are stored in the memory 102. The gradient data $\Delta V1$, $\Delta V2$, and $\Delta V3$ read from the memory 102 are successively summed up by the accumulator 104 in synchronism with the clock signal CLK. The digital-to-analog converter 106 carries out digital-to-analog (D-A) conversion with regard to specific upper bits in the result of summation, thus generating a driving waveform COM. For example, when the result of summation is given as 18-bit data, the upper 10 bits are subjected to the D-A conversion.

In the programmable generation technique, when the result of summation with regard to one period of the waveform is equal to zero, the voltage at the start end of the driving waveform is identical with the voltage at the terminal end of the driving waveform. In the actual conditions, however, there is an error in each period. For example, the gradient data $\Delta V1$ is defined as '$\Delta V1 = \delta 1/8$' to attain a peak voltage $\delta 1$ of the driving waveform by summing up $\Delta V1$ eight times. If the division includes a rounding error, the value of the peak voltage $\delta 1$ also includes an error.

When the cumulative error exceeds a range of lower bits that are omitted in the course of the D-A conversion, the resulting driving waveform is different from an originally expected driving waveform. FIGS. 16A and 16B show effects of calculation errors on the driving waveform. The FIG. 16A represents an ideal driving waveform with no calculation error. The FIG. 16B represents a driving waveform with a calculation error e1 in each period T. Accumulation of the errors e1 gradually shifts the initial potential of the driving waveform, so that the driving waveform after several periods T is significantly different from the ideal driving waveform.

Further accumulation of the errors e1 may lead to an extreme change of the driving waveform due to an overflow or an underflow of the accumulator 104. FIGS. 17A through 17C show effects of the overflow and the underflow of the accumulator 104. In the case where there is no calculation error, the calculated driving waveform is kept in a range between an upper limit UL and a lower limit LL of the accumulator 104 as shown in FIG. 17A. In the case of the overflow where the cumulative error causes the calculated driving waveform to be greater than the upper limit UL, however, the output of the accumulator 104 jumps to a value close to the lower limit LL as shown in FIG. 17B. In the case of the underflow where the cumulative error causes the calculated driving waveform to be lower than the lower limit LL, the output of the accumulator 104 jumps to a value close to the upper limit UL as shown in FIG. 17C. The overflow or the underflow leads to an abrupt change of the driving waveform and undesirably makes the operation of the driving element unstable.

SUMMARY OF THE INVENTION

The object of the present invention is thus to prevent accumulation of errors in the process of generating a driving waveform by calculation, thereby preventing an abrupt change of the driving waveform due to the excess cumulative error.

At least part of the above and the other related objects is attained by a technique of the present invention that successively sums up a plurality of gradient data at a preset calculation period to give a result of summation and carries out digital-to-analog (D-A) conversion with regard to only specific upper columns in the result of summation in synchronism with the preset calculation period, so as to generate a driving waveform. Each gradient data represents a local gradient of the driving waveform and is stored in a memory. In the process of generating the driving waveform, the technique of the present invention corrects the result of summation to a preset value under a predetermined condition. Such correction cancels the potential effects of cumulative error in the result of summation and thereby enables a desired driving waveform to be readily generated.

In accordance with one preferable embodiment of the present invention, the technique clears residual lower columns in the result of summation other than the specific upper columns to zero at a predetermined timing. The lower columns are not subject to the D-A conversion. Clearing the lower columns effectively prevents accumulation of errors without affecting the D-A converted driving waveform.

When the result of summation is data expressed by a predetermined number of bits in a binary number system, the correction is readily carried out by clearing specific lower bits.

Instead of modifying the result of summation directly, another embodiment uses a second memory that stores the preset value, which is given as a modified result. In this structure, the result of summation is replaced with the preset value stored in the second memory at a predetermined timing.

The correction may be carried out at various preset timings. For example, when the driving waveform is a periodical waveform in which a terminal voltage at a terminal end of each period is equal to a starting voltage at a start end of the period, the correction is carried out at a timing corresponding to either one of the start end and the terminal end of each period of the driving waveform. In this case, the result of summation is modified to a value corresponding to the starting voltage. Modification at this timing clears the error in every series of actions of the driving element, thus enabling the periodical driving waveform to be readily kept in a desired state.

In accordance with another preferable embodiment of the present invention, the technique corrects the result of summation to a predetermined value, which is close to a boundary value in a preset range included in an available numerical range of an accumulator that carries out the summation, when the result of summation is out of the preset range. This arrangement effectively prevents an abrupt change of the driving waveform due to an overflow or an underflow in the result of summation.

When the gradient data and the result of summation are data expressed by a two's complement and the preset range is coincident with the available numerical range of the accumulator, the requirement of correction is determined, based on a predetermined combination of an most significant bit representing a sign of the gradient data and a carry bit that represents a state of carry in the summation and is output from the accumulator.

In this embodiment, the accumulator may include an adder that sums up two data and outputs a result of addition; a first latch that temporarily holds the gradient data and inputs the gradient data into the adder; and a second latch that temporarily holds the result of addition output from the adder and inputs the result of addition into the adder. In this structure, either one of an input into and an output from the second latch is modified.

A concrete procedure corrects either one of the input into and the output from the second latch to an upper limit value in the preset range when the result of summation exceeds the upper limit, and corrects either one of the input into and the output from the second latch to a lower limit value in the preset range when the result of summation exceeds the lower limit.

The technique of the present invention is actualized by a diversity of applications, for example, a printing apparatus, a driving waveform generator, and a method of generating a driving waveform.

These and other objects, features, aspects, and advantages of the present invention will become more apparent from the following detailed description of the preferred embodiments with the accompanying drawings.

BRIEF DESCRIPTION OF THE DRAWINGS

FIGS. 10A through 10D show a technique of modifying a result of summation;

FIG. 12 shows outputs of a decision circuit and outputs of a selector;

FIGS. 17A through 17C show effects of an overflow and an underflow of an accumulator.

DESCRIPTION OF THE PREFERRED EMBODIMENTS

Figure 1:
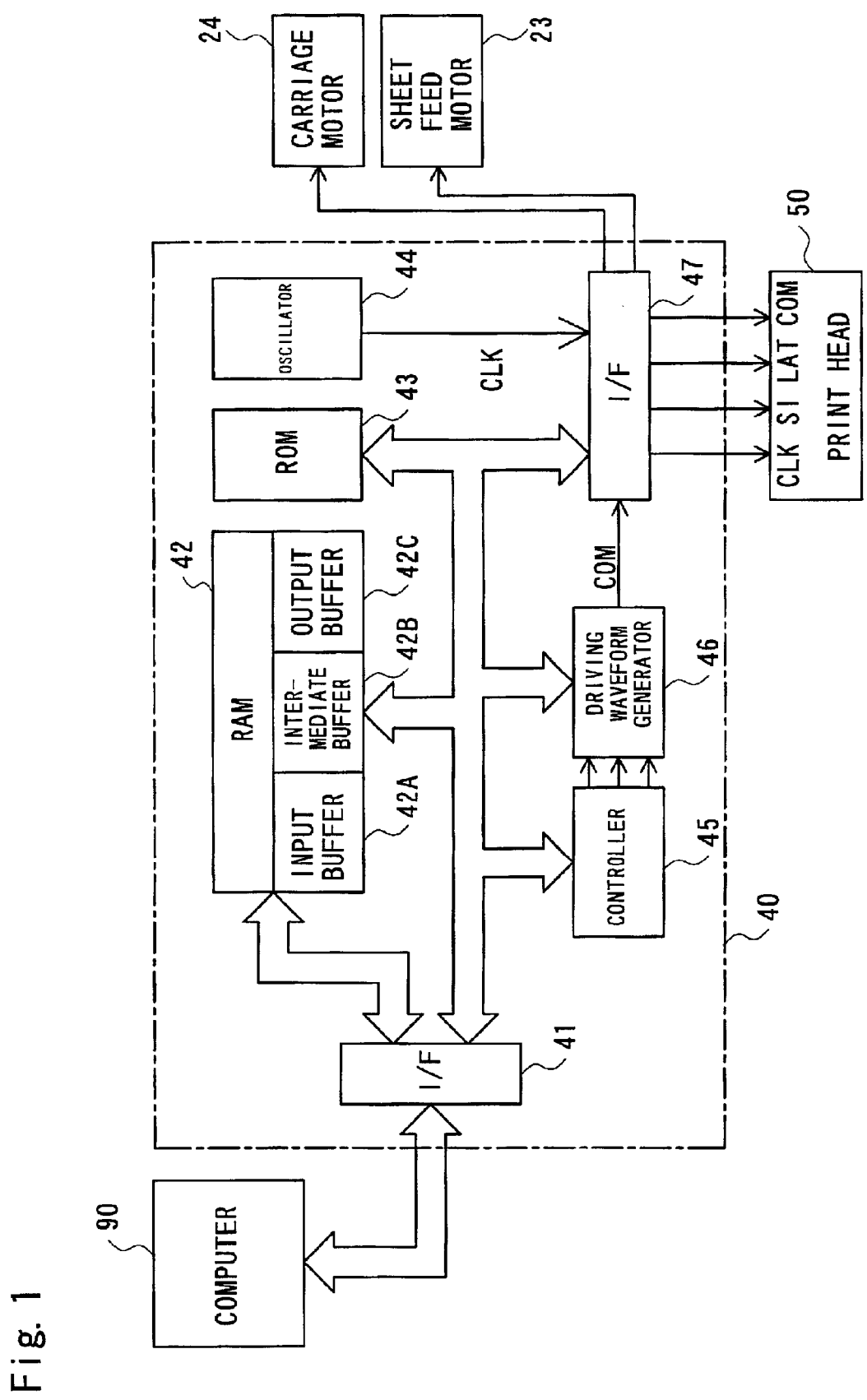
FIG. 1 is a block diagram illustrating the general structure of a printing apparatus in a first embodiment of the present invention.

Embodiments of the present invention will be described as follows:
A. First Embodiment
  A1. General Structure of Printing Apparatus
  A2. Internal Structure of Driving Waveform Generator
  A3. Method of Generating Driving Waveform
  A4. Modified Example
B. Second Embodiment
  B1. Internal Structure of Driving Waveform Generator
  B2. Internal Structure of Anti-inversion Circuit
  B3. Operation of Anti-inversion Circuit
  B4. Modified Example
C. Third Embodiment
D. Modifications A. First Embodiment A1. General Structure of Printing Apparatus FIG. 1 is a block diagram illustrating the general structure of a printing apparatus in a first embodiment of the present invention. The printing apparatus includes a computer 90, a control circuit 40, a sheet feed motor 23, a carriage motor 24 that carries out main scan, and a print head 50. In the printing apparatus, the control circuit 40 receives a printing signal from the computer 90 to control formation of dots according to an original image and drives the respective units to print a resulting image in response to the printing signal.

The control circuit 40 includes an interface 41 that receives the printing signal output from the computer 90, a RAM 42 in which a diversity of data are stored, a ROM 43 in which a variety of processing routines for data processing are stored, an oscillator 44, a controller 45 including a CPU, a driving waveform generation circuit 46, and an interface 47 that sends the printing signal and the driving waveform to the sheet feed motor 23, the carriage motor 24, and the print head 50.

The RAM 42 is used as an input buffer 42A, an intermediate buffer 42B, and an output buffer 42C. The printing signal output from the computer 90 is stored in the input buffer 42A via the interface 41. The data stored in the input buffer 42A are converted to intermediate codes and kept in the intermediate buffer 42B. The controller 45 carries out required processing by referring to font data and graphic functions stored in the ROM 43 and expands the intermediate codes to dot pattern data, which are stored in the output buffer 42C. The dot pattern data are transmitted to the print head 50 via the interface 47.

Figure 2:
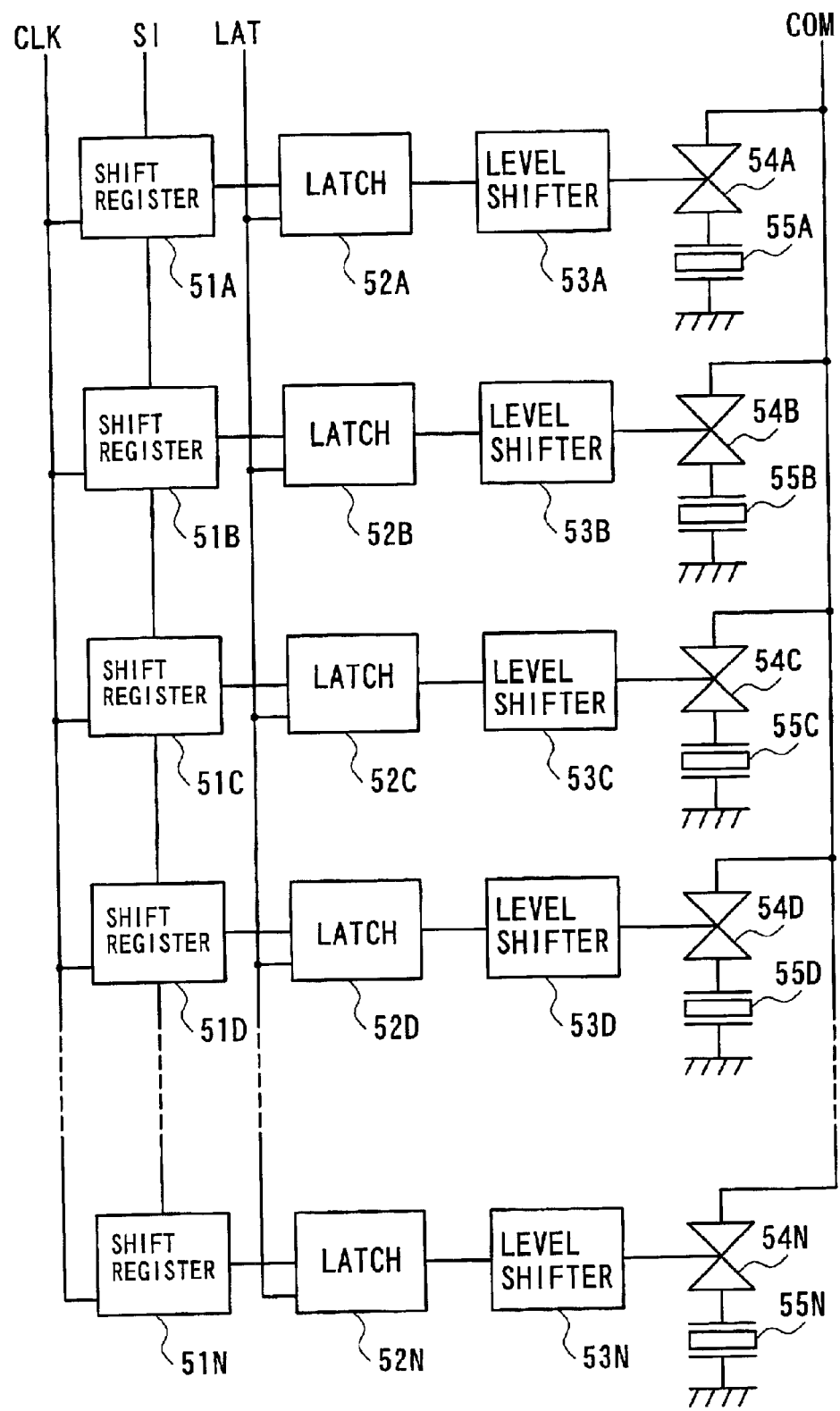
FIG. 2 is a block diagram illustrating the electrical structure of a print head in the printing apparatus.

FIG. 2 is a block diagram illustrating the electrical structure of the print head 50. The print head 50 includes an identical number of shift stores 51A through 51N, latch circuits 52A through 52N, level shifters 53A through 53N, switching circuits 54A through 54N, and piezoelectric elements 55A through 55N working as driving elements. The number of each elements corresponds to the number of nozzles formed in the print head 50. A printing signal SI is input into the shift stores 51A through 51N synchronously with a clock signal CLK output from the oscillator 44. The printing signal SI is a one-bit signal representing ejection or non-ejection of ink with regard to each nozzle. The printing signal SI is latched by the latch circuits 52A through 52N synchronously with a latch signal LAT, amplified by the level shifters 53A through 53N to a specific voltage level that is sufficient for driving the switching circuits 54A through 54N, and supplied to the switching circuits 54A through 54N.

A driving waveform COM generated by the driving waveform generation circuit 46 is received by the input terminals of the switching circuits 54A through 54N, whereas the output terminals of the switching circuits 54A through 54N are respectively connected to the piezoelectric elements 55A through 55N. The switching circuits 54A through 54N supply the driving waveform COM to the piezoelectric elements 55A through 55N only when the printing signal SI is at an H level. In response to the supply of the driving waveform COM, the piezoelectric elements 55A through 55N are deformed according to the waveform and cause ink droplets to be ejected from the corresponding nozzles.

A2. Internal Structure of Driving Waveform Generator

Figure 3:
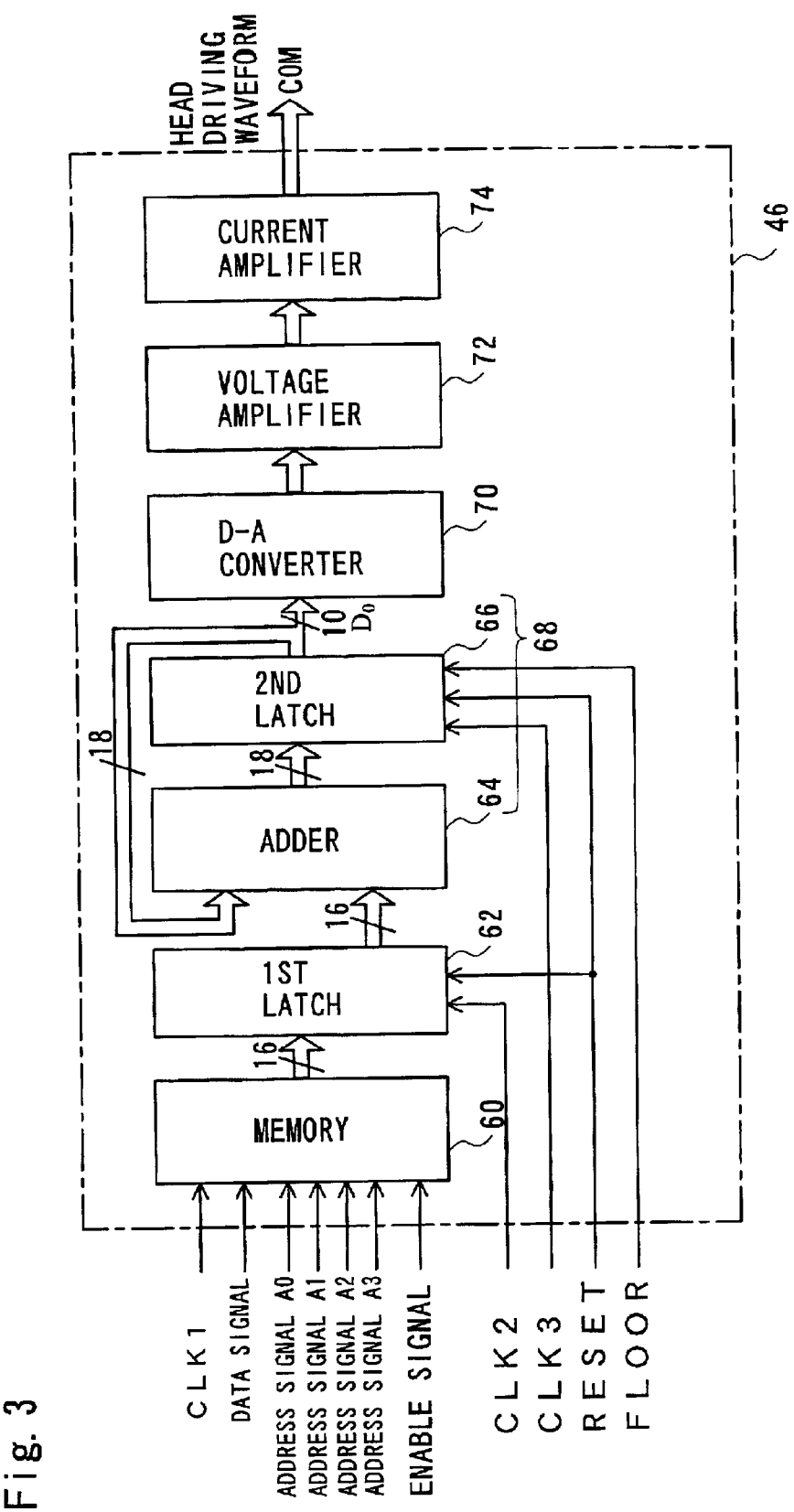
FIG. 3 is a block diagram illustrating the internal structure of a driving waveform generation circuit in the first embodiment.

FIG. 3 is a block diagram illustrating the internal structure of the driving waveform generation circuit 46. The driving waveform generation circuit 46 in combination with the controller 45, the RAM 42, and the ROM 43 shown in FIG. 1 constitutes a driving waveform generator.

In the driving waveform generation circuit 46, a memory 60 stores a plurality of 16-bit gradient data, each representing a variation in driving waveform per unit time. The controller 45 outputs the gradient data prior to generation of a driving waveform. A first latch 62 temporarily holds the 16-bit gradient data read from the memory 60. An adder 64 adds the output of the first latch 62 to the output of a second latch 66 and gives the result of addition to the second latch 66. Namely the second latch 66 successively holds the newest result of the summation by the adder 64. The adder 64 and the second latch 66 constitute an accumulator 68 to sum up the gradient data. The result of summation is given as 18-bit data. The output of the second latch 66 is given to a digital-to-analog (D-A) converter 70, as well as to the adder 64. Here only the upper 10 bits in the 18-bit data are supplied to the D-A converter 70. The D-A converted driving waveform is amplified by a voltage amplifier 72 and a current amplifier 74 to a specific voltage level and a specific current level that are sufficient for driving the piezoelectric elements.

The controller 45 supplies various signals to the driving waveform generation circuit 46. The memory 60 receives a first clock signal CLK1, data signal on which the gradient data are carried, address signals A0 through A3, and an enable signal. The first latch 62 receives a second clock signal CLK2 working as a trigger signal of the first latch 62 and a reset signal RESET. The second latch 66 receives a third clock signal CLK3 working as a trigger signal of the second latch 66, the reset signal RESET, and a floor signal FLOOR. The reset signal RESET is common to the first latch 62 and the second latch 66.

A3. Method of Generating Driving Waveform

The driving waveform generation circuit 46 carries out the summation and the D-A conversion to generate a driving waveform. The result of summation is given as 18-bit data, and the upper 10 bits in the 18-bit data are subjected to the D-A conversion. The residual lower 8 bits are cleared at a preset timing, in order to cancel the potential effects of the cumulative error due to the summation. The following describes the method of generating the driving signal in detail.

Figure 4:
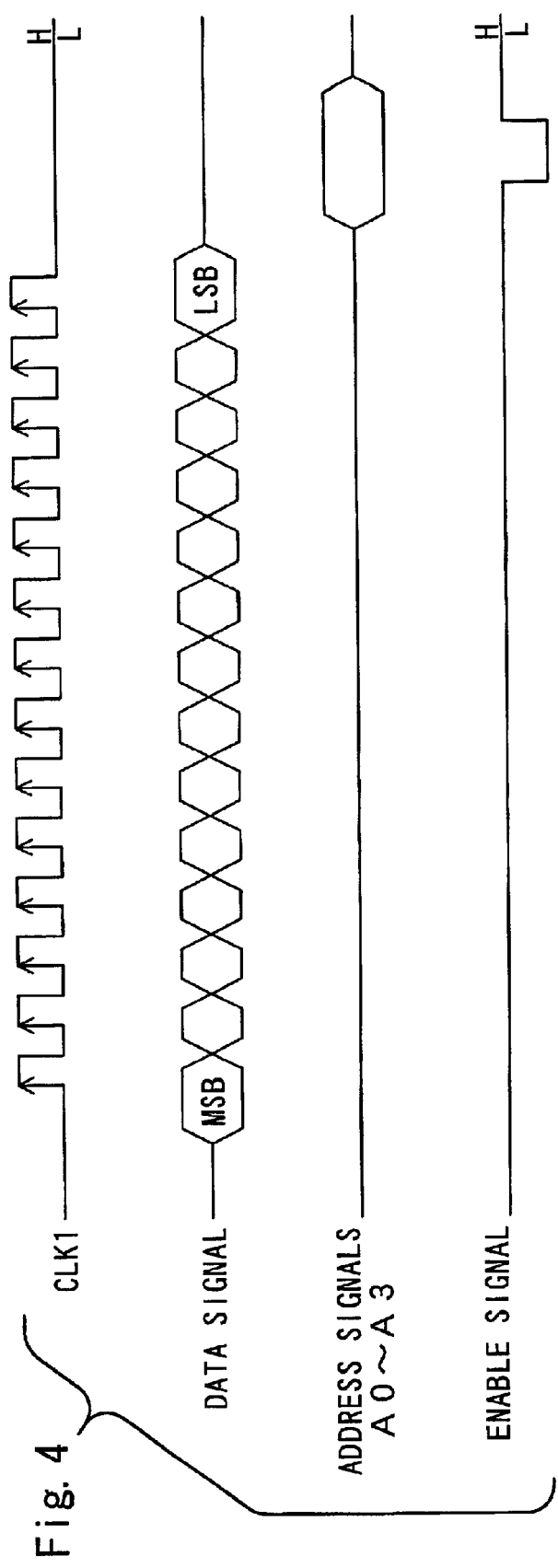
FIG. 4 is a timing chart showing a process of writing gradient data into a memory.

Prior to generation of the driving waveform COM, the memory 60 receives from the controller 45 the 16-bit gradient data and an address specifying the place where the 16-bit gradient data is stored in the memory 60. FIG. 4 is a timing chart showing a process of writing the gradient data into the memory 60. The gradient data are serially transferred by one bit in synchronism with the first clock signal CLK1. On completion of the transfer of the gradient data, the 4-bit address signals A0 through A3 are transferred in parallel, and the enable signal is supplied. The memory 60 writes the input gradient data at the specified address in response to the enable signal as a trigger. The address signals A0 through A3 are 4-bit signals, so that 16 gradient data at the maximum are stored in the memory 60.

Figure 5:
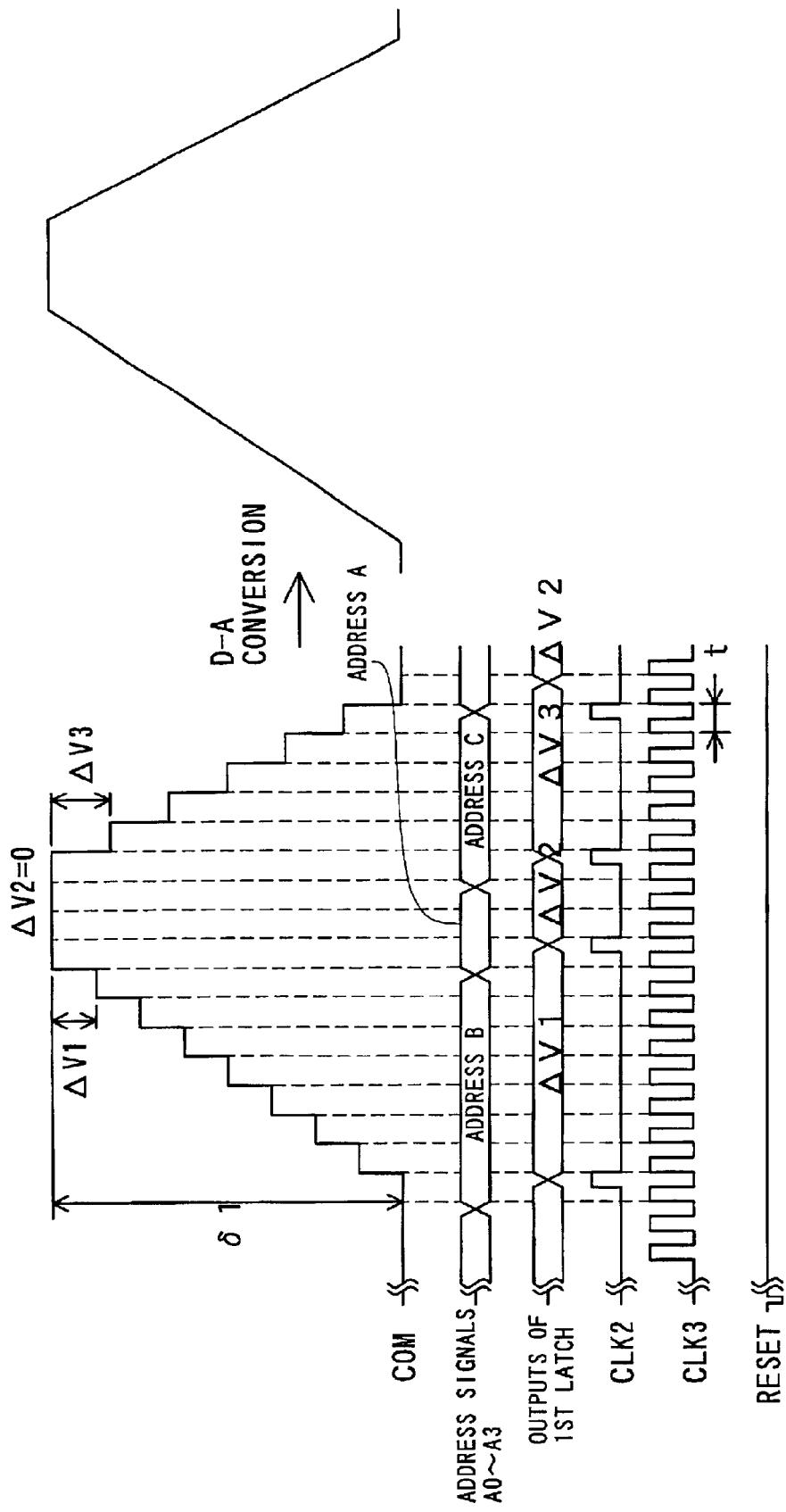
FIG. 5 shows a process of generating a driving waveform.

FIG. 5 shows a process of generating the driving waveform. In this example, the following three gradient data are stored at respective addresses in the memory 60.

Address A→Gradient Data $\Delta V2=0$
Address B→Gradient Data $\Delta V1>0$
Address C→Gradient Data $\Delta V3<0$ Each gradient data represents a variation in voltage of the driving waveform in a period t of the third clock signal CLK3.

When the address B is output on the address signals A0 through A3, the gradient data $\Delta V1$ corresponding to this address is output from the memory 60. The data $\Delta V1$ is held in the first latch 62 in response to the second clock signal CLK2 as a trigger. The adder 64 adds the 16-bit data output from the first latch 62 to the 18-bit data output from the second latch 66 in response to the pulse of the third clock signal CLK3. The result of addition is held in the second latch 66. As clearly shown in FIG. 5, in response to every pulse of the third cock signal CLK3, the output of the second latch 66 is accumulated by the gradient data $\Delta V1$ to have a stepwise variation.

When the second clock signal CLK2 is output after elapse of a predetermined time period, the gradient data $\Delta V2$ corresponding to the currently output address A is output from the memory 60. Since the gradient data $\Delta V2=0$, the driving waveform becomes plateau. In a similar manner, in response to the effective address C, the voltage gradually drops by the gradient data ΔV3. The gradient data are expressed in the form of a complement, and the sign (plus or minus) of the gradient data is specified by the value of the most significant bit.

Voltage level data $D_0$, that is, the upper 10 bits in the resulting 18-bit data summed up by the adder 64, is subjected to the D-A conversion carried out in the D-A converter 70 to give a driving waveform shown in the right half of FIG. 5.

Figure 6:
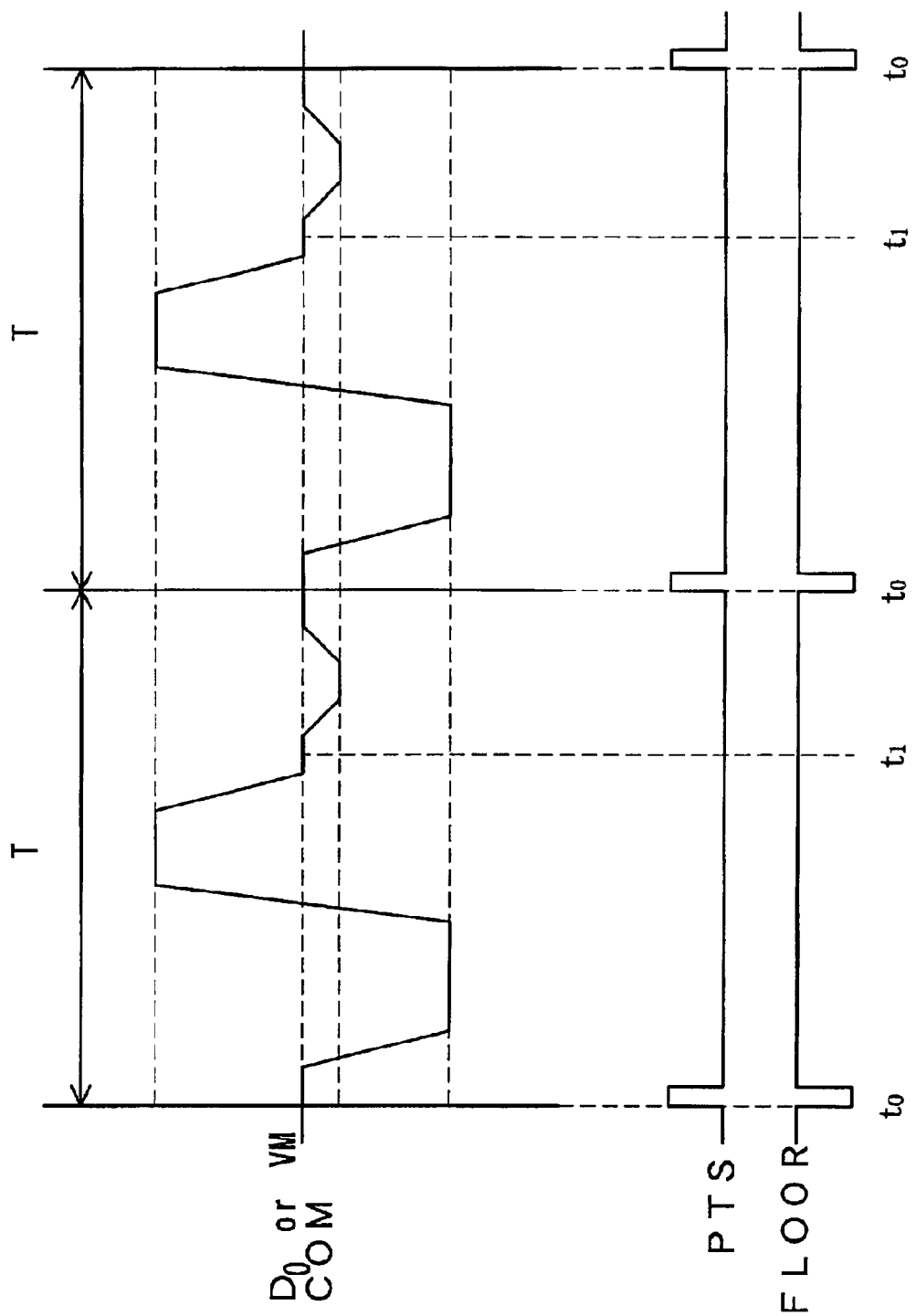
FIG. 6 is a timing chart showing a timing of clearing lower 8 bits in data of a second latch.

FIG. 6 is a timing chart showing the timings of clearing the lower 8 bits in the 18-bit data held in the second latch 66. In this example, an identical driving waveform corresponding to each pixel is generated at a preset period T. The preset period T is defined by a print timing signal PTS output from the controller 45, that is, a command signal for starting output of the driving waveform to create a dot in each pixel. A value VM (hereinafter referred to as the start level) of the voltage level data $D_0$ at the start end and the terminal end of each period T is set equal to a predetermined value that is not equal to zero.

The floor signal FLOOR specifies timings t0 to clear the lower 8 bits in the 18-bit data held in the second latch 66. In this embodiment, the floor signal FLOOR is output at the same timings as the print timing signal PTS. The print timing signal PTS may be used as the floor signal FLOOR.

In response to the input of the floor signal FLOOR from the controller 45 into the second latch 66, only the lower 8 bits in the 18-bit data held in the second latch 66 are cleared. Since the clearing operation is carried out at the start end of each period T, the upper 10 bits are kept at the start level VM. The 18-bit data held in the second latch 66 thus strictly represents the start level VM.

The technique of this embodiment clears the calculation error due to a rounding error included in the gradient data at preset timings, thereby preventing accumulation of the errors and enabling a desired driving waveform to be readily generated.

The clearing operation may be carried out at any timing when the strict value of the voltage level data D0 is known. For example, the lower 8 bits may be cleared at timings t1 when the voltage level data D0 output from the second latch 66 is equal to VM.

A4. Modified Example

Figure 7:
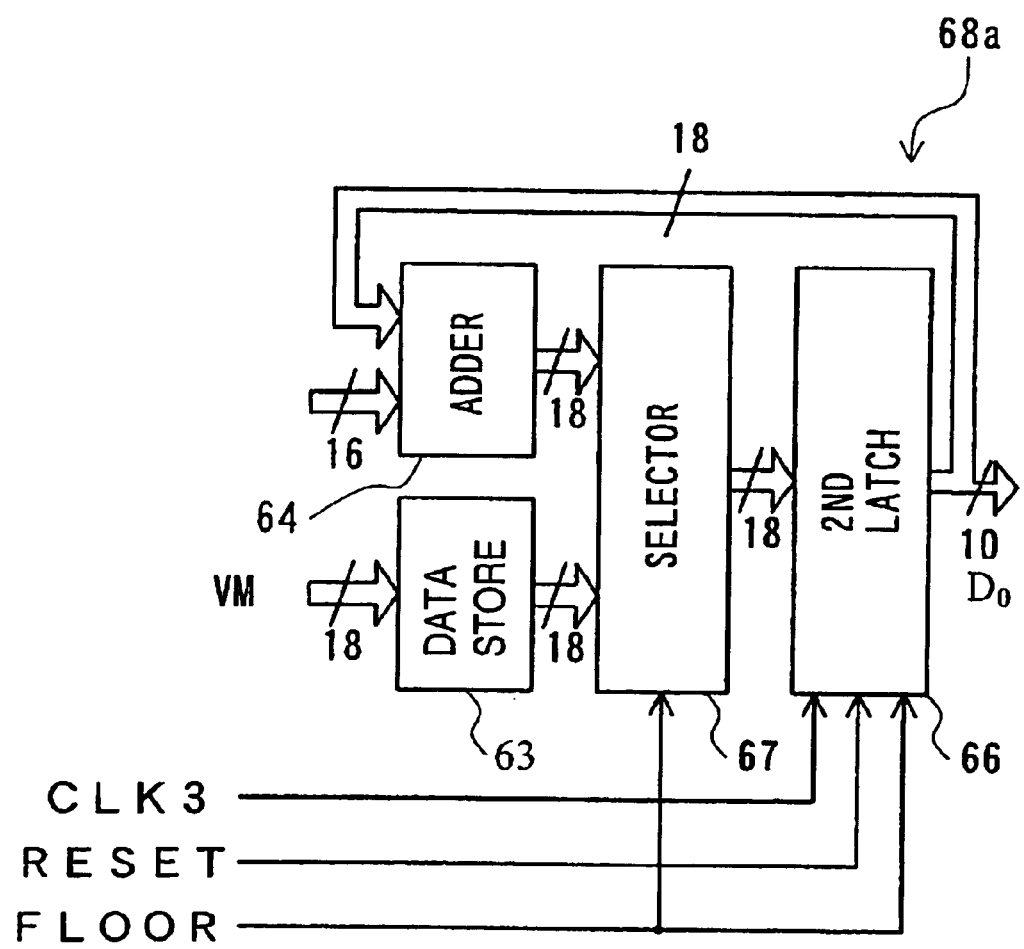
FIG. 7 is a block diagram illustrating the structure of another accumulator included in the driving waveform generation circuit of the first embodiment as a modified example.

FIG. 7 is a block diagram showing the structure of a modified accumulator 68a in the driving waveform generation circuit 46 of the first embodiment. The difference from the first embodiment is that this accumulator 68a has a selector 67, which is disposed between the adder 64 and the second latch 66 and is connected with a data store 63. The floor signal FLOOR is input into the selector 67.

The data store 63 holds 18-bit data stored therein. Upper 10 bits in the 18-bit data are identical with the start level VM of the driving waveform, whereas lower 8 bits are equal to zero. The selector 67 selects either one of the output of the adder 64 and the output of the data store 63 and gives the selected output to the second latch 66. In response to the input of the floor signal FLOOR, the selector 67 selects the output of the data store 63. This arrangement causes the 18-bit data held in the second latch 66 to be forcibly rewritten to the 18-bit data having the upper 10 bits identical with the start level VM and the lower 8 bits equal to zero, in response to the floor signal FLOOR.

The arrangement of the modified example replaces the result of summation with a predetermined value at specified timings, thereby preventing accumulation of errors.

In the circuit of the first embodiment discussed previously, the lower 8 bits are cleared in response to the floor signal FLOOR. This means that the result of summation is set equal to the predetermined value, that is, the start level VM. The expression 'setting the result of summation equal to a predetermined value' in this specification is not restricted to the case of forcibly setting the result of summation equal to the predetermined value, but also includes the case of clearing only the lower bits to substantially set the result of summation equal to the predetermined value like the first embodiment.

B. Second Embodiment

While the first embodiment prevents accumulation of errors, a second embodiment of the present invention prevents an extreme variation in driving waveform due to an overflow or an underflow of the result of summation with the cumulative error.

B1. Internal Structure of Driving Waveform Generator

Figure 8:
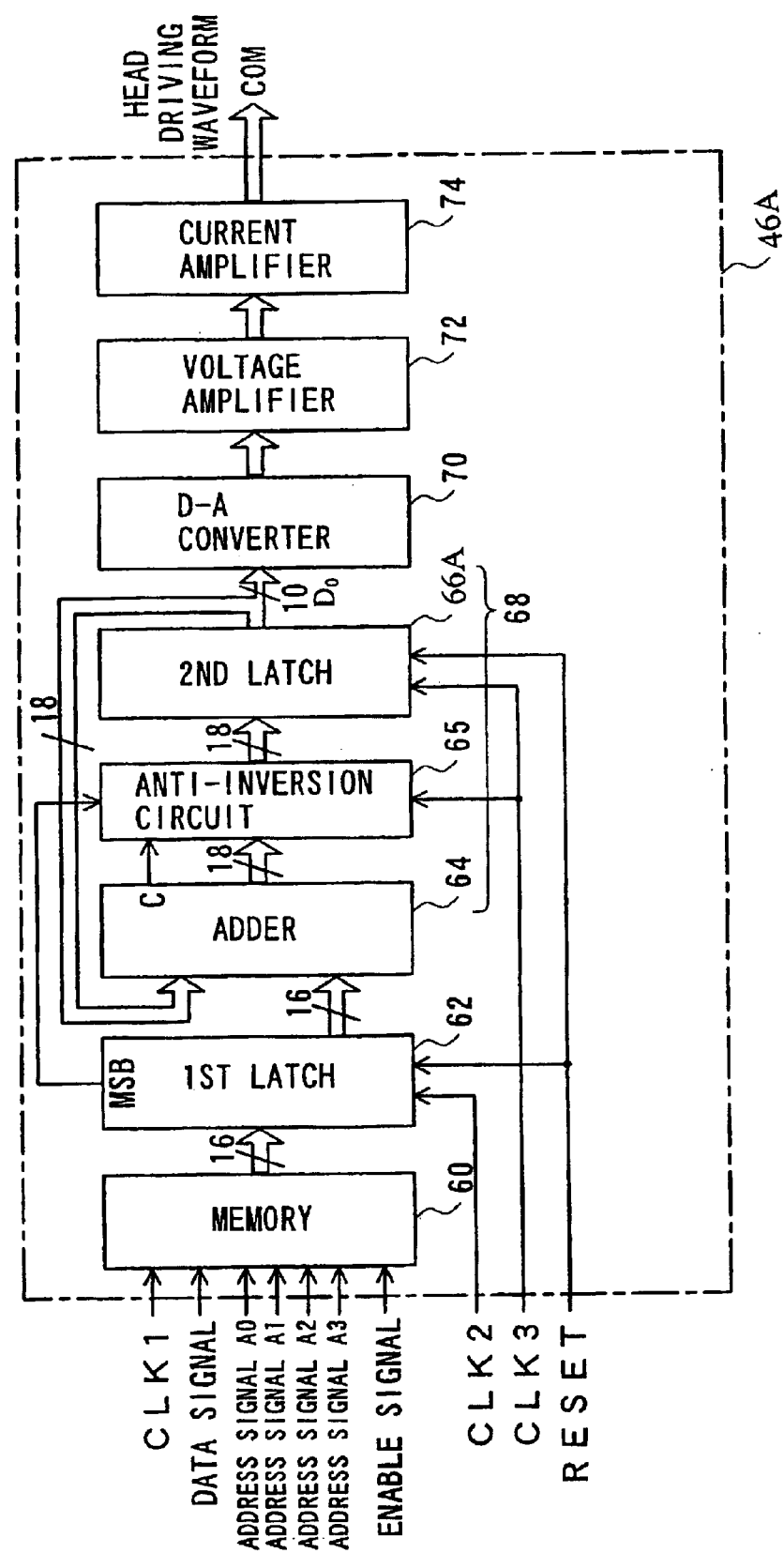
FIG. 8 is a block diagram illustrating the internal structure of a driving waveform generation circuit in a second embodiment of the present invention.

FIG. 8 is a block diagram illustrating the internal structure of a driving waveform generation circuit 46A in the second embodiment of the present invention. The difference from the driving waveform generation circuit 46 of the first embodiment is that an anti-inversion circuit 65 functioning as a circuit of modifying the result of summation is disposed between the adder 64 and a second latch 66A. When there is an overflow or an underflow in the result of summation by the adder 64, the anti-inversion circuit 65 corrects the result of summation to a value within an available range of the adder 64 and outputs the modified value to the second latch 66A. In order to attain such correction, the anti-inversion circuit 65 receives a carry signal C that is input from the adder 64 and represents a state of carry, and an most significant bit MSB that is input from the first latch 62 and corresponds to the sign (plus or minus) of the gradient data. The anti-inversion circuit 65 is activated synchronously with the third clock signal CLK3.

B2. Internal Structure of Anti-Inversion Circuit

Figure 9:
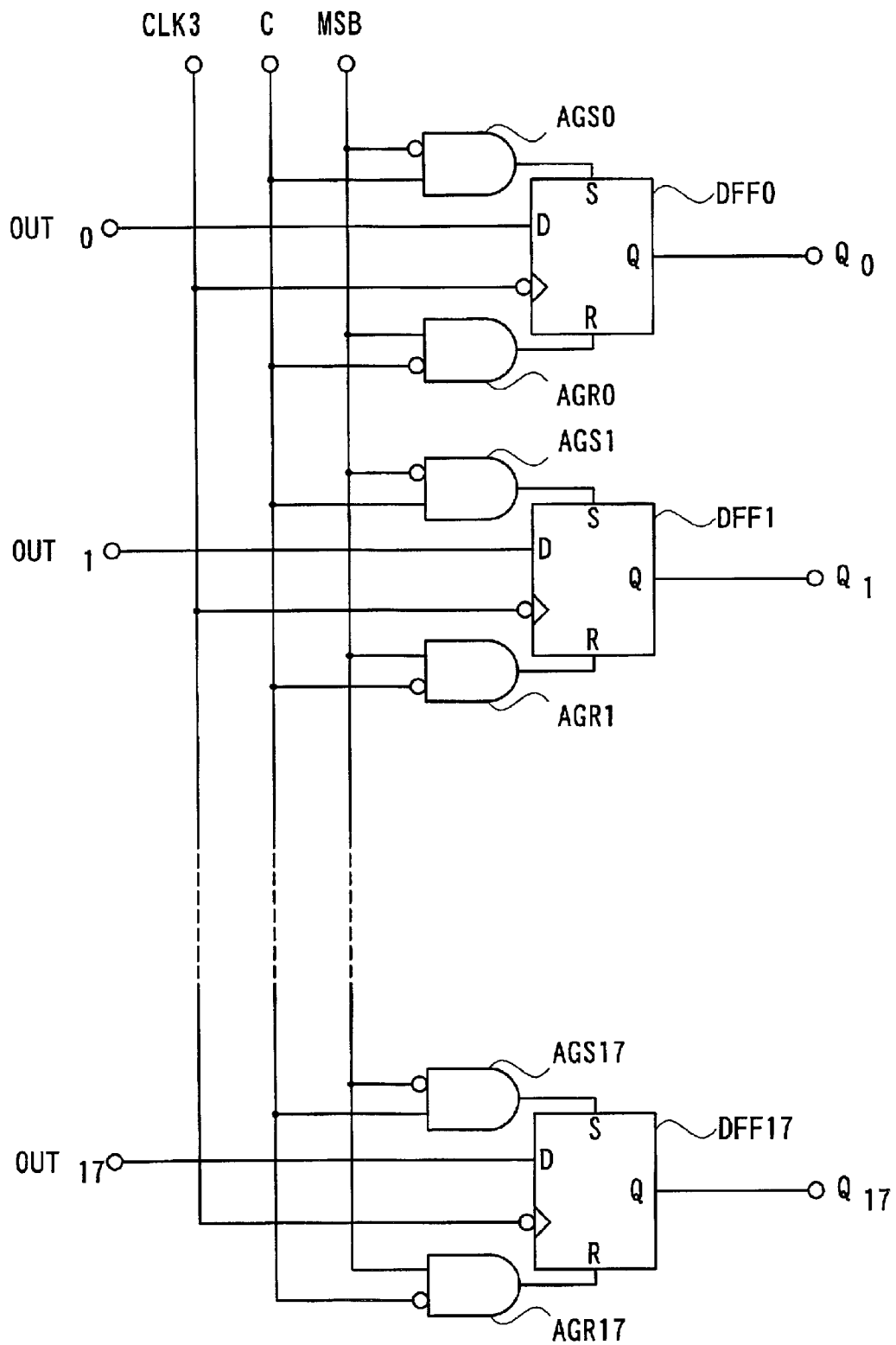
FIG. 9 is a block diagram illustrating the internal structure of an anti-inversion circuit.

FIG. 9 is a block diagram illustrating the internal structure of the anti-inversion circuit 65. The anti-inversion circuit 65 has a combined circuit of two AND gates and one D-flip flop provided for each bit of the 18-bit data that are transferred from the adder 64 to the second latch 66A via the anti-inversion circuit 65. For example, a combined circuit of AND gates AGS0 and AGR0 and a D-flip flop DFF0 is provided for an $OUT_0$ bit in the result of summation output from the adder 64. The AND gate AGS0 receives an inversion signal of the most significant bit MSB of the gradient data and the carry signal C input from the adder 64, and outputs their logical product to a set terminal S of the D-flip flop DFF0. The AND gate AGR0, on the other hand, receives the most significant bit MSB of the gradient data and an inversion signal of the carry C, and outputs their logical product to a reset terminal R of the D-flip flop DFF0. The D-flip flop DFF0 updates an output $Q_0$ to the second latch 66A in synchronism with a falling edge of the clock signal CLK3 as discussed below.

In the case where the set terminal S=0 and the reset terminal R=0, the result of summation $OUT_0$ is output without any correction. The case corresponds to a first state in which both the most significant bit MSB of the gradient data and the carry signal C are equal to zero. In the first state, the calculation is summation of positive gradient data and no carry is required. This means that there is no overflow in the result of summation. The case also corresponds to a second state in which both the most significant bit MSB of the gradient data and the carry signal C are equal to one. In the second state, the calculation is summation of negative gradient data and a carry is required. Since the gradient data and the result of summation are expressed in the form of complements, this means that there is no underflow in the result of summation.

In the case where the set terminal S=0 and the reset terminal R=1, the output $Q_0$ is reset to '0'. The case corresponds to a state in which the most significant bit MSB=1 and the carry signal C=0. In this state, the calculation is summation of negative gradient data and no carry is required. In the expression of the complement, this means that there is an underflow in the result of summation.

In the case where the set terminal S=1 and the reset terminal R=0, the output $Q_0$ is set to '1'. The case corresponds to a state in which the most significant bit MSB=0 and the carry signal C=1. In this state, the calculation is summation of positive gradient data and a carry is required. This means that there is an overflow in the result of summation.

The anti-inversion circuit 65 has similar combined circuits of two AND gates AGS1 through AGS 17, AGR1 through AGR17 and one D-flip flop DFF1 through DFF17 provided for respective bits $OUT_1$ through $OUT_{17}$ in the result of summation. In the embodiment of FIG. 9, a pair of AND gates are provided individually for each of the D-flip flops DFF0 through DFF17. In one possible correction, the D-flip flops DFF0 through DFF17 may share one pair of AND gates AGS0 and AGR0.

B3. Operation of Anti-Inversion Circuit

Like the first embodiment, the technique of the second embodiment successively sums up the gradient data to generate a driving waveform. The anti-inversion circuit 65 determines whether or not the result of summation exceeds an available range of the adder 64 ('000 . . . 000 'to '111 . . . 111' in the case of 18-bit data) and corrects the result of summation if exceeding.

The gradient data is 16-bit data where a negative value is expressed in the form of a two's complement. Since the calculation is carried out with 18 bits, the adder 64 converts the input gradient data into a complement of 18 bits. The conversion is readily performed by duplicating the value of the most significant bit (the $16^{th}$ bit) of the gradient data in the $17^{th}$ bit and the $18^{th}$ bit.

FIGS. 10A through 10D show the technique of modifying the result of summation. For the clarity of explanation, the result of summation is given as 8-bit data, and the gradient data is given as 6-bit data. In this case, the calculation is carried out with 8 bits. The adder 64 accordingly converts the input gradient data into a complement of 8 bits by duplicating the value of the most significant bit MSB (the encircled value) of the gradient data in the $7^{th}$ bit and the $8^{th}$ bit.

In the example of FIG. 10A, gradient data '010110' (22 in the decimal numeral system) is added to a result of summation '11100100' (228 in the decimal numeral system). The gradient data is a positive value, so that the most significant bit MSB=0. The calculation causes no carry, so that the carry signal C=0. This means that there is no overflow in the result of summation. In this case, the set terminal S=0 and the reset terminal R=0 are input into the D flip-flop DFF. The result of summation '11111010' is thus output without any correction.

In the example of FIG. 10B, gradient data '010110' (22 in the decimal numeral system) is added to a result of summation '11101011' (235 in the decimal numeral system). The gradient data is a positive value, so that the most significant bit MSB=0. The calculation causes a carry, so that the carry signal C=1. This means that there is an overflow in the result of summation. In this case, the set terminal S=1 and the reset terminal R=0 are input into the D flip-flop DFF. The upper limit value '11111111' is accordingly output as the modified result of summation.

In the example of FIG. 10C, gradient data '101010' (−22 in the decimal numeral system) is added to a result of summation '00011101' (29 in the decimal numeral system). The gradient data is a negative value, so that the most significant bit MSB=1. The calculation causes a carry, so that the carry signal C=1. This means that there is no underflow in the result of summation. In this case, the set terminal S=0 and the reset terminal R=0 are input into the D flip-flop DFF. The result of summation '00000111' is thus output without any correction.

In the example of FIG. 10D, gradient data '101010' (−22 in the decimal numeral system) is added to a result of summation '00001101' (13 in the decimal numeral system). The gradient data is a negative value, so that the most significant bit MSB=1. The calculation causes no carry, so that the carry signal C=0. This means that there is an underflow in the result of summation. In this case, the set terminal S=0 and the reset terminal R=1 are input into the D flip-flop DFF. The lower limit value '00000000' is accordingly output as the modified result of summation.

When the result of summation exceeds either the upper limit value or the lower limit value of the available range in the adder 64, the technique of the second embodiment forcibly corrects the result of summation to the upper limit value or the lower limit value. This arrangement effectively prevents an abrupt change of the driving voltage waveform due to an overflow or an underflow in the result of summation.

In the event that there is an overflow or an underflow in the result of summation, the technique of the second embodiment forcibly corrects the result of summation to the upper limit value (an 18-bit value having '1' in all bits) or the lower limit value (an 18-bit value having '0' in all bits) of the adder. Arbitrary values close to the upper limit value and the lower limit value may, however, be used for the correction, in place of the upper limit value and the lower limit value. For example, a preset value having '0' in all specific lower bits and '1' in all residual upper bits may replace the upper limit value.

The second embodiment regards the arrangement that determines the requirement of correction, based on the occurrence of an overflow or an underflow. The limit values used for the decision may be set arbitrarily. For example, in the case of an 8-bit adder having an available range of 0 to 255 in the decimal numeral system, one modified structure compares the result of summation with a preset upper limit value '250' and a preset lower limit value '5' in a preset range of 5 to 250, instead of the upper limit value '255'and the lower limit value '0' in the available range. In this structure, when the result of summation exceeds either the upper limit value or the lower limit value of a preset range, the result of summation is modified to a predetermined value in the preset range.

B4. Modified Example

Figure 11:
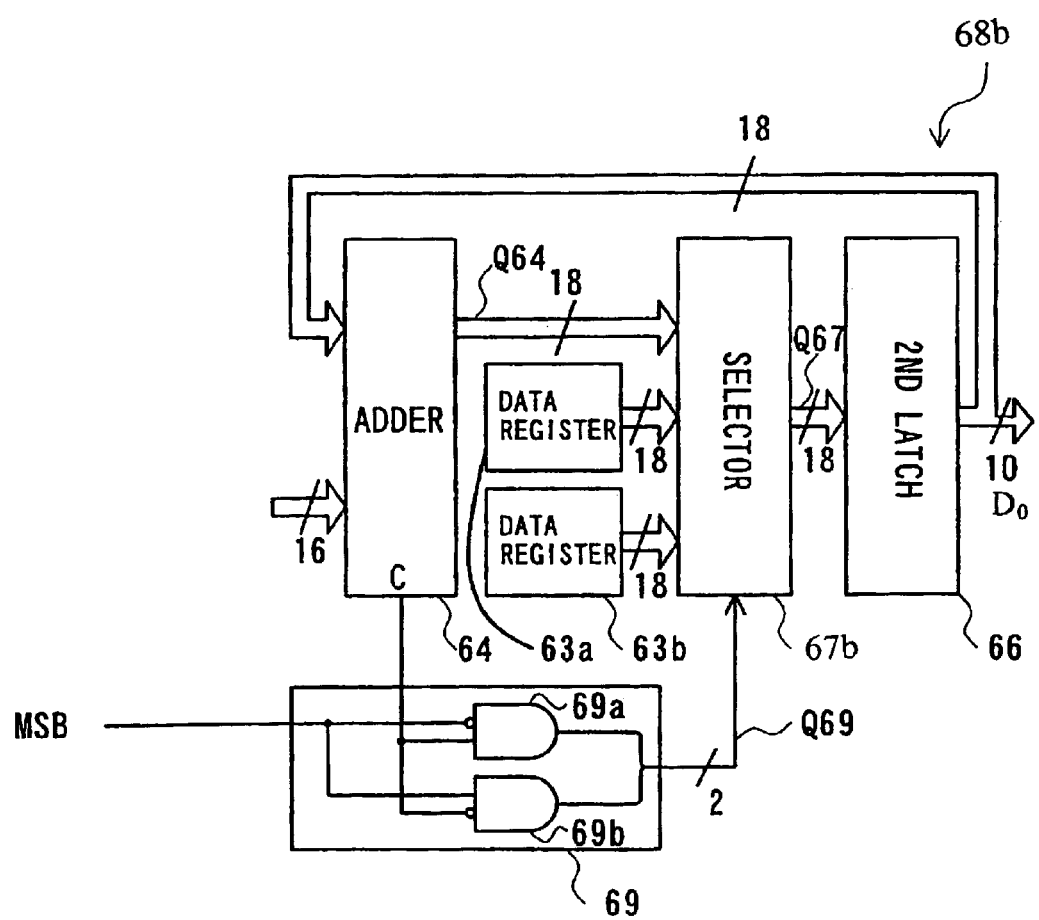
FIG. 11 is a block diagram illustrating the structure of another accumulator included in the driving waveform generation circuit of the second embodiment as a modified example.

FIG. 11 is a block diagram showing the structure of another accumulator 68b included in the driving waveform generation circuit 46A of the second embodiment as a modified example. The difference from the second embodiment is that the accumulator 68b of the modified example includes a selector 67b, a pair of data stores 63a and 63b, and a decision circuit 69, in place of the anti-inversion circuit 65.

The data store 63a holds 18-bit data with '1' in all bits stored therein, whereas the data store 63b holds 18-bit data with '0' in all bits stored therein. The selector 67b selects and outputs one of three data of the data store 63a, the data store 63b, and the adder 64 according to the output of the decision circuit 69.

The decision circuit 69 includes a pair of AND gates 69a and 69b. The inputs into these AND gates 69a and 69b are identical with the inputs into the AND gates AGS0 and AGR0 discussed above with FIG. 9. The decision circuit 69 outputs 2-bit data Q69 representing a state of overflow or underflow in the result of summation, based on the carry signal C output from the adder 64 and the most significant bit MSB of the gradient data.

FIG. 12 shows outputs Q69 of the decision circuit 69 and outputs Q67 of the selector 67b. When both the carry C and the most significant bit MSB of the gradient data are equal to '0' or equal to '1', there is no overflow or underflow. The decision circuit 69 accordingly generates the output Q69=00, and the selector 67b selects and outputs data Q64 of the adder 64, that is, the result of summation. When the carry C=0 and the most significant bit MSB=1, there is an underflow. The decision circuit 69 accordingly generates the output Q69=01, and the selector 67b selects and outputs the data in the data store 63b, that is, the 18-bit data with '0' in all bits. When the carry C=1 and the most significant bit MSB=0, there is an overflow. The decision circuit 69 accordingly generates the output Q69=10, and the selector 67b selects and outputs the data in the data store 63a, that is, the 18-bit data with '1' in all bits.

Like the second embodiment, the circuit structure of this modified example effectively prevents an abrupt change of the driving voltage waveform due to an overflow or an underflow in the result of summation.

C. Third Embodiment

Figure 13:
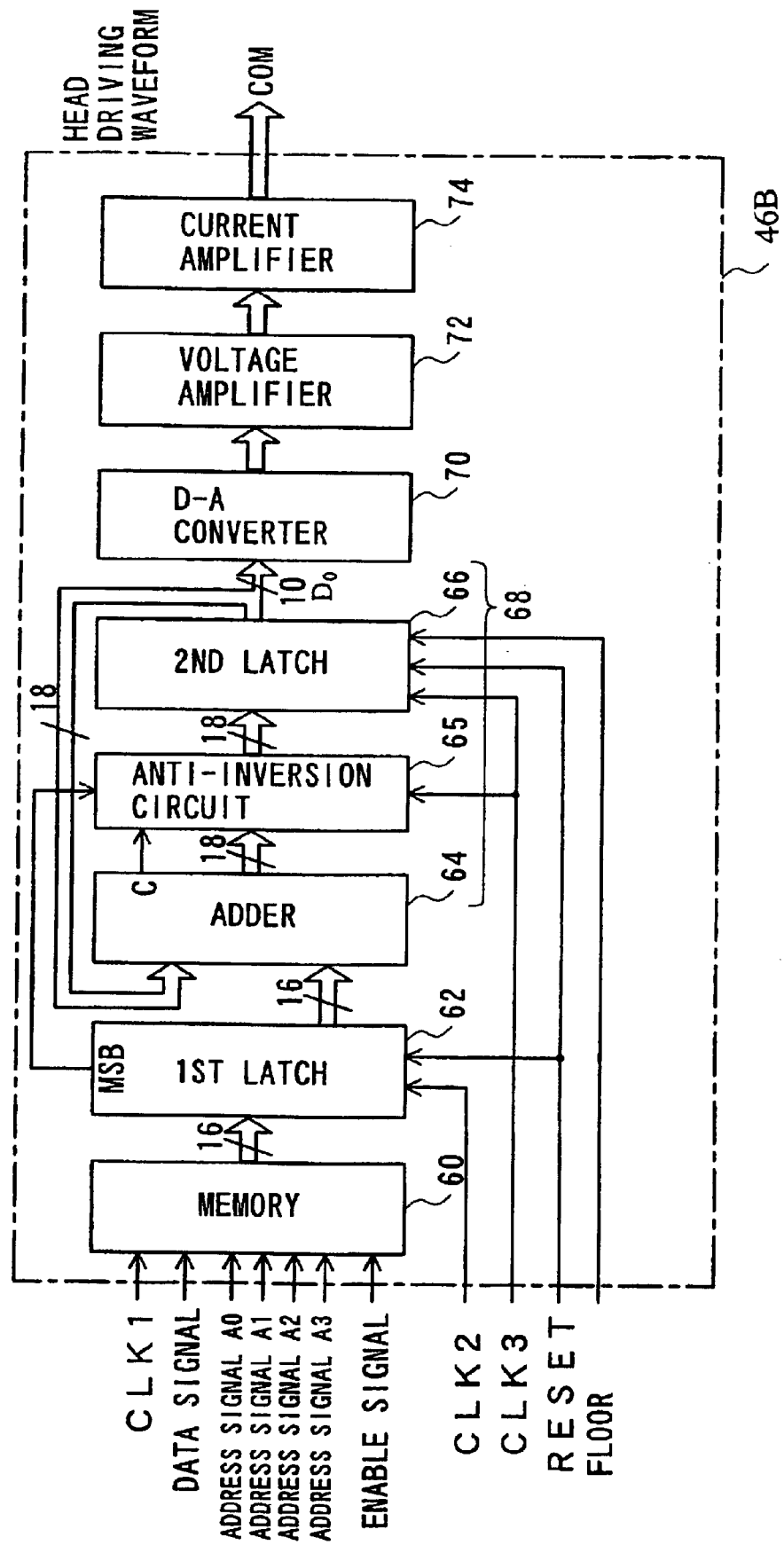
FIG. 13 is a block diagram illustrating the internal structure of a driving waveform generation circuit in a third embodiment of the present invention.
Figure 14:
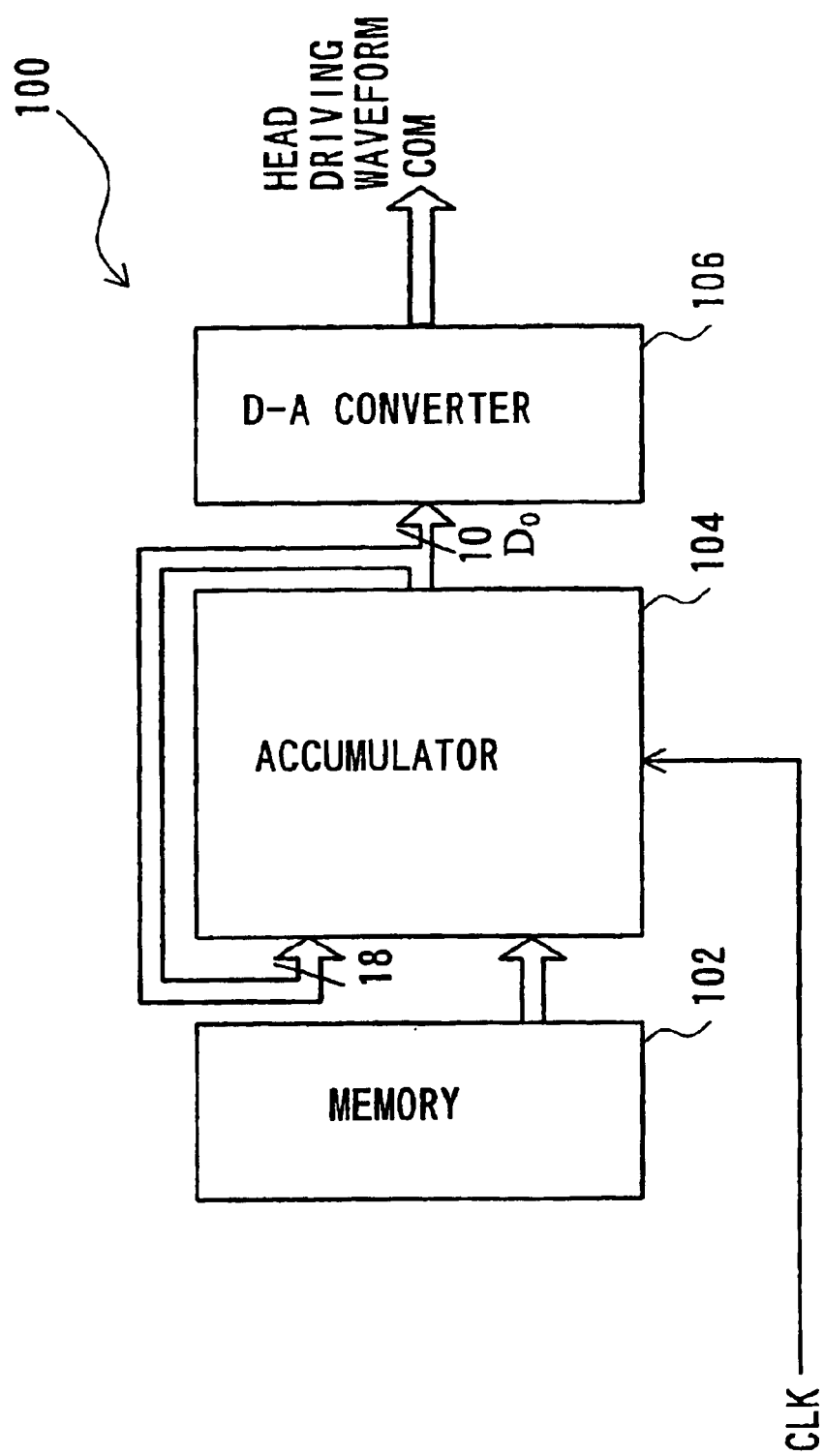
FIG. 14 is a block diagram illustrating the internal structure of a prior art driving waveform generation circuit that actualizes the programmable generation technique.
Figure 15:
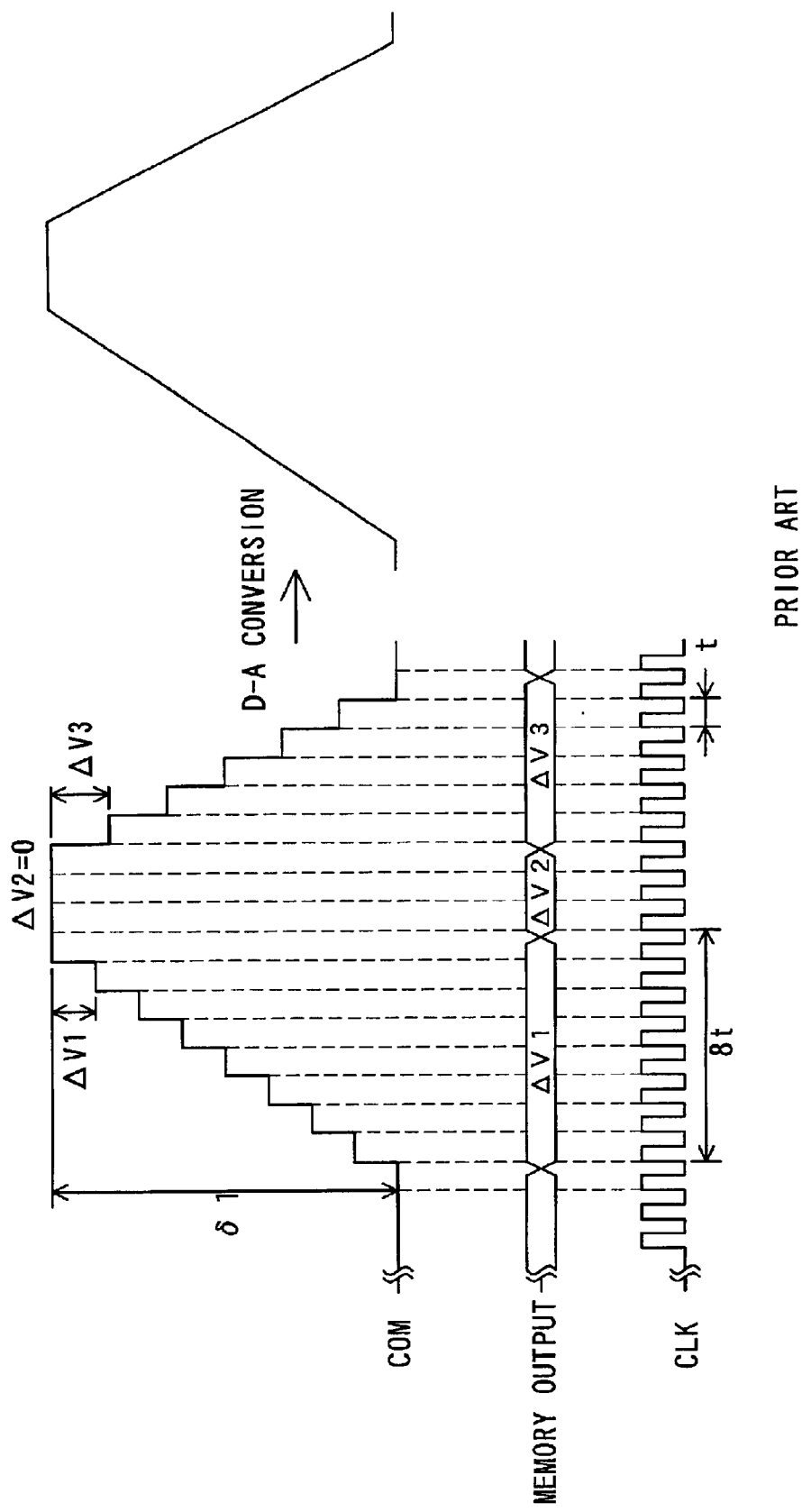
FIG. 15 shows a process of generating a driving waveform by the programmable generation technique.
Figure 16A:
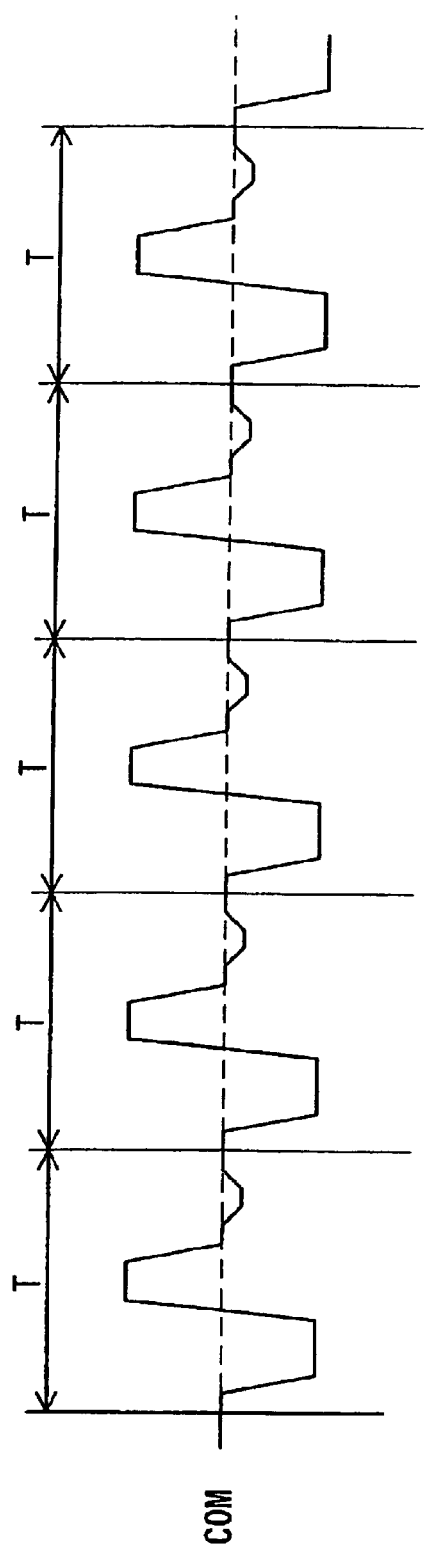
FIGS. 16A and 16B show effects of calculation errors on the driving waveform.
Figure 16B:
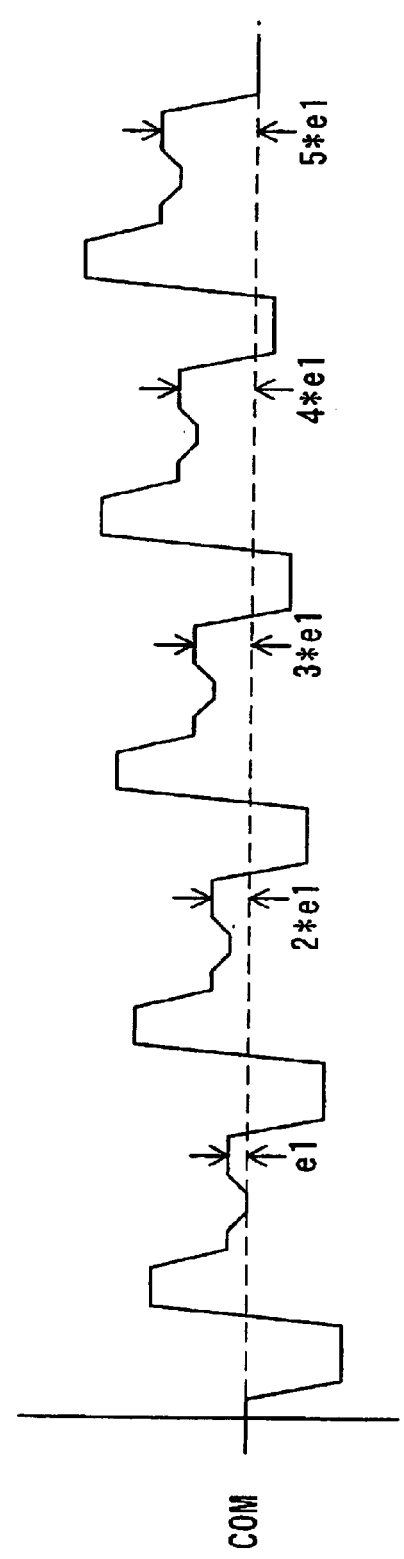

FIG. 13 is a block diagram illustrating the internal structure of a driving waveform generation circuit 46B in a third embodiment of the present invention. The driving waveform generation circuit 46B corresponds to a combination of the first embodiment with the second embodiment. In the driving waveform generation circuit 46B of the third embodiment, the anti-inversion circuit 65 is disposed between the adder 64 and the second latch 66 like the second embodiment, while the floor signal FLOOR is input into the second latch 66 like the first embodiment.

The anti-inversion circuit 65 carries out the operations as discussed in the second embodiment, while the second latch 66 carries out the operations as discussed in the first embodiment. Namely the lower 8 bits in the result of summation are periodically cleared by the second latch 66 in synchronism with the floor signal FLOOR. The anti-inversion circuit 65 prevents an overflow and an underflow in the result of summation.

The arrangement of the third embodiment effectively prevents accumulation of errors included in the gradient data like the first embodiment and also prevents an abrupt change of the driving voltage waveform even if there is an overflow or an underflow in the result of summation like the second embodiment.

D. Modifications

The present invention is not restricted to the above embodiments or their corrections, but there may be many other corrections, changes, and alterations without departing from the scope or spirit of the main characteristics of the present invention. For example, the technique of the present invention is not restricted to generation of the driving waveform for piezoelectric elements, but is applicable to generation of the driving waveform for any actuators.

The scope and spirit of the present invention are limited only by the terms of the appended claims.

What is claimed is:

1. A driving waveform generator that generates a driving waveform to drive a driving element, said driving waveform generator comprising:
   a memory that stores a plurality of gradient data, each representing a local gradient of the driving waveform;
   an accumulator that successively sums up one of the gradient data stored in said memory at each of a plurality of calculation periods;
   a digital-to-analog converter that converts only specific upper columns in a result of summation obtained by said accumulator at each calculation period into an analog signal; and
   a correction unit that corrects the result of summation to a preset value under a specific condition.

2. A driving waveform generator in accordance with claim 1, wherein said correction unit corrects residual lower columns other than the specific upper columns in the result of summation to zero at a predetermined timing.

3. A driving waveform generator in accordance with claim 2, wherein the result of summation is expressed by a predetermined number of bits in a binary number system, and
   said correction unit carries out the correction by clearing specific lower bits corresponding to said residual lower columns.

4. A driving waveform generator in accordance with claim 1 further comprising:
   a second memory that stores the preset value,
   wherein said correction unit executes the corrections by replacing the result of summation with the preset value stored in,
   said second memory at a predetermined timing.

5. A driving waveform generator in accordance with claim 1, wherein said correction unit corrects the result of summation to a value corresponding to the starting voltage at the end of each period of the driving waveform so that the driving waveform is a periodical waveform in which a terminal voltage at a terminal end of each period is equal to a starting voltage at a start end of the period.

6. A driving waveform generator in accordance with claim 1, wherein when the result of summation is to exceed a preset range within an available numerical range of the result of summation by the accumulator, said correction unit corrects the result of summation to a predetermined value which is close to a boundary value of the preset range.

7. A driving waveform generator in accordance with claim 6, wherein the gradient data and the result of summation are expressed by a two's complement,
   the preset range is coincident with the available numerical range of said accumulator,
   said accumulator outputs a state of carry in the summation as a carry bit, and
   said correction unit carries out the correction when a most significant bit representing a sign of the gradient data and the carry bit have values of a predetermined combination.

8. A driving waveform generator in accordance with claim 6, wherein said accumulator comprises:
   an adder that sums up two data and outputs a result of addition;

a first latch that temporarily holds the gradient data and inputs the gradient data into said adder; and a second latch that temporarily holds the result of addition output from said adder and inputs the result of addition into said adder;

wherein said correction unit corrects either one of an input and an output of said second latch.

9. A driving waveform generator in accordance with claim 8, wherein said correction unit corrects either one of the input and the output of said second latch to an upper limit value in the preset range when the result of summation exceeds the upper limit, and corrects either one of the input and the output of said second latch to a lower limit value in the preset range when the result of summation exceeds the lower limit.

10. A printing apparatus that ejects ink to print an image comprising:

a print head having a nozzle and a driving element that drives said nozzle; and a driving waveform generator for generating a driving waveform that is applied to said driving element;

wherein said driving waveform generator includes;

a memory that stores a plurality of gradient data, each representing a local gradient of the driving waveform;

an accumulator that successively sums up one of the gradient data stored in said memory at each of a plurality of calculation periods;

a digital-to-analog converter that converts only specific upper columns in a result of summation obtained by said accumulator at each calculation period into an analog signal; and a correction unit that corrects the result of summation to a preset value under a specific condition.

11. A method of generating a driving waveform to drive a driving element, said method comprising the steps of:

(a) successively summing up gradient data, each representing a local gradient of the driving waveform, at each of a plurality of preset calculation periods;

(b) converting only specific upper columns in a result of summation obtained in said step (a) at each preset calculation period into an analog signal; and (c) correcting the result of summation to a preset value under a specific condition.

12. A method in accordance with claim 11, wherein said step © includes the step of correcting residual lower columns in the result of summation other than the specific upper columns to zero at a predetermined timing.

13. A method in accordance with claim 11, wherein said step © includes the step of when the result of summation is to exceed a preset range within an available numerical range of the result of summation, correcting the result of summation to a predetermined value which is close to a boundary value of the preset range.

* * * * *